US012603598B1

(12) United States Patent

Pappert

(10) Patent No.: US 12,603,598 B1

(45) Date of Patent: Apr. 14, 2026

(54) ENHANCED SEEBECK EFFECT RENEWABLE ENERGY ARRANGEMENT WITH RESISTOR

(71) Applicant: Bernard Pappert, Austin, TX (US)

(72) Inventor: Bernard Pappert, Austin, TX (US)

( * ) Notice: Subject to any disclaimer, the term of this patent is extended or adjusted under 35 U.S.C. 154(b) by 0 days.

(21) Appl. No.: 19/267,734

(22) Filed: Jul. 14, 2025

(51) Int. Cl.
| | |
|---|---|
| *H10N 10/00* | (2023.01) |
| *H02J 7/35* | (2006.01) |
| *H02S 10/10* | (2014.01) |
| *H02S 20/10* | (2014.01) |
| *H02S 40/22* | (2014.01) |

(52) U.S. Cl.
CPC ................ *H02S 10/10* (2014.12); *H02J 7/35* (2013.01); *H02S 20/10* (2014.12); *H02S 40/22* (2014.12); *H10N 10/00* (2023.02)

(58) Field of Classification Search
CPC ............ H10N 10/00–857; Y02E 10/10; Y02E 10/40–47; Y02E 10/60; H02S 10/30; H02S 40/40–44
USPC ................................................ 136/200–242
See application file for complete search history.

(56) References Cited

U.S. PATENT DOCUMENTS

| | | | | |
|---|---|---|---|---|
| 4,106,952 | A | * | 8/1978 | Kravitz .................. H10F 77/68 |
| | | | | 136/246 |
| 8,334,450 | B2 | | 12/2012 | Micallef |
| D701,828 | S | | 4/2014 | Garrett-Schesch |

| | | | | |
|---|---|---|---|---|
| 8,975,505 | B2 | | 3/2015 | Ladner |
| 10,267,296 | B2 | | 4/2019 | Zhang |
| 11,480,350 | B2 | | 10/2022 | Al-Amri |
| 2012/0247538 | A1 | | 10/2012 | Zhao |
| 2013/0291919 | A1 | | 11/2013 | Lu |
| 2014/0367068 | A1 | | 12/2014 | Liu |
| 2018/0013048 | A1 | * | 1/2018 | Insanic ................ H10N 10/852 |
| 2023/0354708 | A1 | * | 11/2023 | Oh ......................... H10N 10/17 |

FOREIGN PATENT DOCUMENTS

| | | | | | |
|---|---|---|---|---|---|
| CN | 110429866 | A | * | 11/2019 | .......... H02N 11/002 |
| CN | 113315416 | | | 8/2021 | |
| JP | 2004039966 | A | * | 2/2004 | |
| WO | WO2011076107 | | | 6/2011 | |
| WO | WO-2024127876 | A1 | * | 6/2024 | ................ H02J 3/38 |

OTHER PUBLICATIONS

WO-2024127876-A1 English (Year: 2024).*
JP-2004039966-A English (Year: 2004).*
CN-110429866-A English (Year: 2019).*

* cited by examiner

*Primary Examiner* — Bach T Dinh

(57) ABSTRACT

A Seebeck effect renewable energy arrangement can be used to generate electricity due to temperature differences. The Seebeck effect renewable energy arrangement includes an environmental arrangement, a ground arrangement, and a power output arrangement. The environmental arrangement is connected to the ground arrangement to create an electrical circuit such that the temperature difference between the environmental temperature and the ground temperature generates electricity due to the Seebeck effect. The ground arrangement includes a loop of electrically-conductive metal wire and a resistor. The power output arrangement is operatively connected to the circuit to conduct electricity generated thereby to storage or use to power electrical devices.

13 Claims, 8 Drawing Sheets

ENHANCED SEEBECK EFFECT RENEWABLE ENERGY ARRANGEMENT WITH RESISTOR

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

Renewable energies are a focus of many societies. However, they have limitations and issues with efficiency. For example, large areas of land are devoted to wind turbines and solar panels. Solar panels only collect energy when the sun is shining. Depending on the surrounding climate, solar panels can get as hot as 65° C. (149° F.), at which point solar cell efficiency will be hindered.

A solar concentrator is used to capture and focus sun rays to generate temperatures up to 2000° C. by using mirrors and parabolic reflectors of a trough, tower, and dish systems or refractive lens. Solar magnification is simply concentrating solar energy into a smaller area using a magnifying glass or something similar. Solar concentrators put one of these lenses on top of every solar cell. This makes much more focused light come to each solar cell, making the cells vastly more efficient.

It would be advantageous to take advantage of these high temperatures and solar and geothermal energy and generate electricity to supplement the energy already being collected by new and existing systems. In that regard, the Seebeck effect is the conversion of temperature differences directly into electricity. The Seebeck effect is a phenomenon in which a temperature difference between two dissimilar electric conductors or semi-conductors produces a voltage difference between those two substances to generate electricity.

The disclosure relates to a renewable energy arrangement and more particularly pertains to a new Seebeck effect renewable energy arrangement for generating electricity due to temperature differences. A resistor is added near the typical cold end of the loop on the thicker loop side to increase the loop voltage and therefore the efficiency and power generated.

(2) Description of Related Art Including Information Disclosed Under 37 CFR 1.97 and 1.98

The prior art relates to renewable energy arrangements and collectors. The prior art does not disclose a Seebeck effect renewable energy arrangement for generating electricity due to temperature differences. The prior art further does not disclose a loop of electrically-conductive metal wire configured to be buried in the ground or submerged in water.

BRIEF SUMMARY OF THE INVENTION

An embodiment of the disclosure meets the needs presented above by generally comprising Seebeck effect renewable energy arrangement for generating electricity due to temperature differences that includes an environmental arrangement, a ground arrangement that has a resistor added on the thicker metal side near the typical cold end of the loop, and a power output arrangement. The environmental arrangement is designed to be heated or cooled by surrounding environmental conditions to an environmental temperature. The ground arrangement is designed to be heated or cooled by geothermal energy to a ground temperature different from the environmental temperature. The environmental arrangement is connected to the ground arrangement to create an electrical circuit such that the temperature difference between the environmental temperature and the ground temperature generates electricity due to the Seebeck effect. The ground arrangement includes a loop of electrically-conductive metal wire and a resistor. The power output arrangement is operatively connected to the circuit to conduct electricity generated thereby to storage or use to power electrical devices.

To generally explain and in accordance with at least one possible embodiment, a DC current loop made of copper or similar metal can be buried in the ground or water where during the summer the ground level temperature at times might be 30° F. higher than the mean earth temperature 30 feet down. The top of the loop could also be connected to a solar panel that is hot, may be 149° F., and the bottom level of the loop to the ground to generate a usable temperature difference via the Seebeck effect.

Another solar energy collection is to connect the top of the loop to a solar concentrator that elevates the temperature to several hundred degrees Fahrenheit and the bottom level of the loop to the ground to generate a large temperature difference so that the metal loop can be replaced by thermoelectric generators (TEG).

TEGs or copper loop could also be connected between shallow hot geothermal and a platform isolated from the ground and at air temperature.

To utilize the Seebeck effect, the top side of a metal loop is hot and the bottom side is cold, or vice versa, to create a temperature difference. The difference with a current loop buried in the ground or water is that there is a continuous temperature gradient from the top ground level to the bottom of the loop 30 feet down so effectively multiple loop equivalents. A current loop using copper wires could include a thick loop half with added resistor near the typical cold end, and a thin loop half, wherein the thick loop half could have approximately six times (6×) the cross-sectional area of the thin loop half (1×). If the top end of the loop at ground level is hot and the bottom end of the loop 30 feet down is cold, the current flowing down in the thick loop half will cancel out the current flowing down in the thin loop half so that the resulting loop DC current will be 6×−1×=5×. The same analysis works for water 30 to 50 feet deep.

When heat is applied to one end of the two conductors or semi-conductors then the electrons become excited due to the heat. Since only one of the two loop ends is heated, the electrons start moving towards the cooler end of the two conductors in accordance with the Seebeck effect. If the metals or semi-conductors are connected through an electrical circuit, direct current flows through the circuit.

A loop can be placed in the ground with the top of the loop at the surface and then the bottom of the loop located 30 feet below the surface. At soil depths greater than 30 feet below the surface, the soil temperature is a relatively constant number year-round and corresponds roughly to the water temperature measured in groundwater wells 30 to 50 feet deep. This is referred to as the "mean earth temperature." The mean earth temperature in Texas, for example, is 71° F. and when the surface ground temperature is 91° F. or 51° F. then the difference is +/−20° F. The loop current will change directions depending on whether the top surface is hotter or colder than the mean earth temperature. The ground level surface temperature could be increased by focusing the sun with a lens.

There is a temperature gradient from the hotter ground level to the mean temperature 30 feet down so effectively there are many electrons flowing down on each side of the copper loop. For example, the number of free electrons in one cubic centimeter of copper is $8.4×10^{}22$. One centimeter is 0.4 inches. One copper atom contributes one free electron. If the diameter of the copper in the down side of the loop is 0.4 inches and the up side diameter 0.15 inches the current in the down side current would be 7× the down current in the return up side resulting in a DC loop current of 6× after the cancellation. Consider that from ground level down 30 feet there are 30 feet×12 inches/0.4 inches times $8.4×10^{}22=7.56×10^{**}25$ valence electrons available to flow from hot to cold. Instead of one Seebeck effect with hot at one end and cold at the other end of a loop there are effectively 30 feet×12 inches/0.4 inches equal 900 loops because of the temperature gradient that exists from the ground level down to the mean temperature 30 feet down.

Instead of a single loop there can be multiple loops forming a strand to increase the energy output. Connecting numerous loops in parallel at the top ground level increases the maximum deliverable current. Connecting numerous loops in series increases the voltage in that leg and the final return up side must be sized to carry the resulting total current. Using 20 loops to complete a strand would have a roughly 11-inch diameter increasing the valence electron for the above example to $151.2×10^{**}25$.

The amplitude of soil temperature change at the ground surface is typically in the range of 20-25° F. The amplitude of seasonal changes in soil temperature on either side of the mean earth temperature depends on the type of soil and depth below the ground surface. In Virginia, for example, the amplitude of soil temperature change at the ground surface is typically in the range of 20-25° F., depending on the extent and type of vegetation cover. At soil depths greater than 30 feet below the surface, the soil temperature is relatively constant, and corresponds roughly to the water temperature measured in groundwater wells 30 to 50 feet deep. This is referred to as the "mean earth temperature." Deeper soils not only experience less extreme seasonal variations in temperature, but the changes that do occur lag farther behind those of shallower soils. This shifts the soil temperature profile later in the year, such that it more closely matches the demand for heating and cooling.

A mid-temperature trough solar concentrator or collector with multi-surface concentration can easily achieve high temperature above 100° C. (212° F.) under operating conditions and could be used as the hot side connection and the ground as the cold side for a current loop or TEG described later. When the ground surface temperature is 70° F. and the solar concentrator at 200° F. then the voltage difference is 130° F. and sufficient for the TEG operation.

Any thermoelectric effect involves the conversion of differences in temperatures into voltage differences. A TEG is an electric device that converts heat energy produced from a heat source directly into electrical energy. A TEG is also called a Seebeck generator, as it is a solid state device that converts heat flux or temperature differences directly into electrical energy through the Seebeck effect.

Shallow geothermal energy is essentially the warmth of the Earth's crust—from 1.5 meters deep all the way down to 300 or 400 meters deep. The heat originates from the earth's core and is therefore the cleanest and practically inexhaustible source of energy. The cold loop connection could be made to a platform isolated in the air. The temperature copper turns to liquid is 1084° C. (1983° F.).

In accordance with at least one possible embodiment, a strand of copper or other metal current loops could be buried elongated 30 feet into the ground or 50 feet into water. A solar concentrator at the top level connection increases the temperature and therefore the energy collection efficiency.

In accordance with at least one possible embodiment, a strand of copper or other metal current loop could have a hot side connected to a hot solar panel and the cold side to ground.

In accordance with at least one possible embodiment, a strand of copper or other metal current loops or TEG could have a hot side connected to a solar concentrator and the cold side to ground.

In accordance with at least one possible embodiment, a strand of copper or other metal current loops or thermoelectric generator TEG could be connected between shallow geothermal and an isolated platform at air temperature.

The ground- or water-buried loop will generate loop current at all times except when there is no temperature difference between the ground level temperature and the relatively constant mean temperature 30 feet down. The most energy will be generated during the hot summer and coldest winter months with the largest temperature deltas.

Different metals other than copper can be used to form the down and up portions of the DC current loop. Thermoelectric generators can also be used.

Instead of loop strands another approach is to just use a much larger copper cross section on the down side of the loop with added resistor and a much smaller copper cross section on the loop return up side. The larger down side cross section more than cancels the smaller loop return up side resulting in a loop DC current. Different metals can be used for the up and down sides of the loop return up side in order to generate a resulting loop DC current.

Thermoelectric generators TEG can also be used with a solar concentrator.

It should be understood that any one of a solar panel, solar concentrator, or air-temperature platform could be used in conjunction with a TEG or the loop or a combination of a TEG and the loop, in accordance with at least one possible embodiment.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
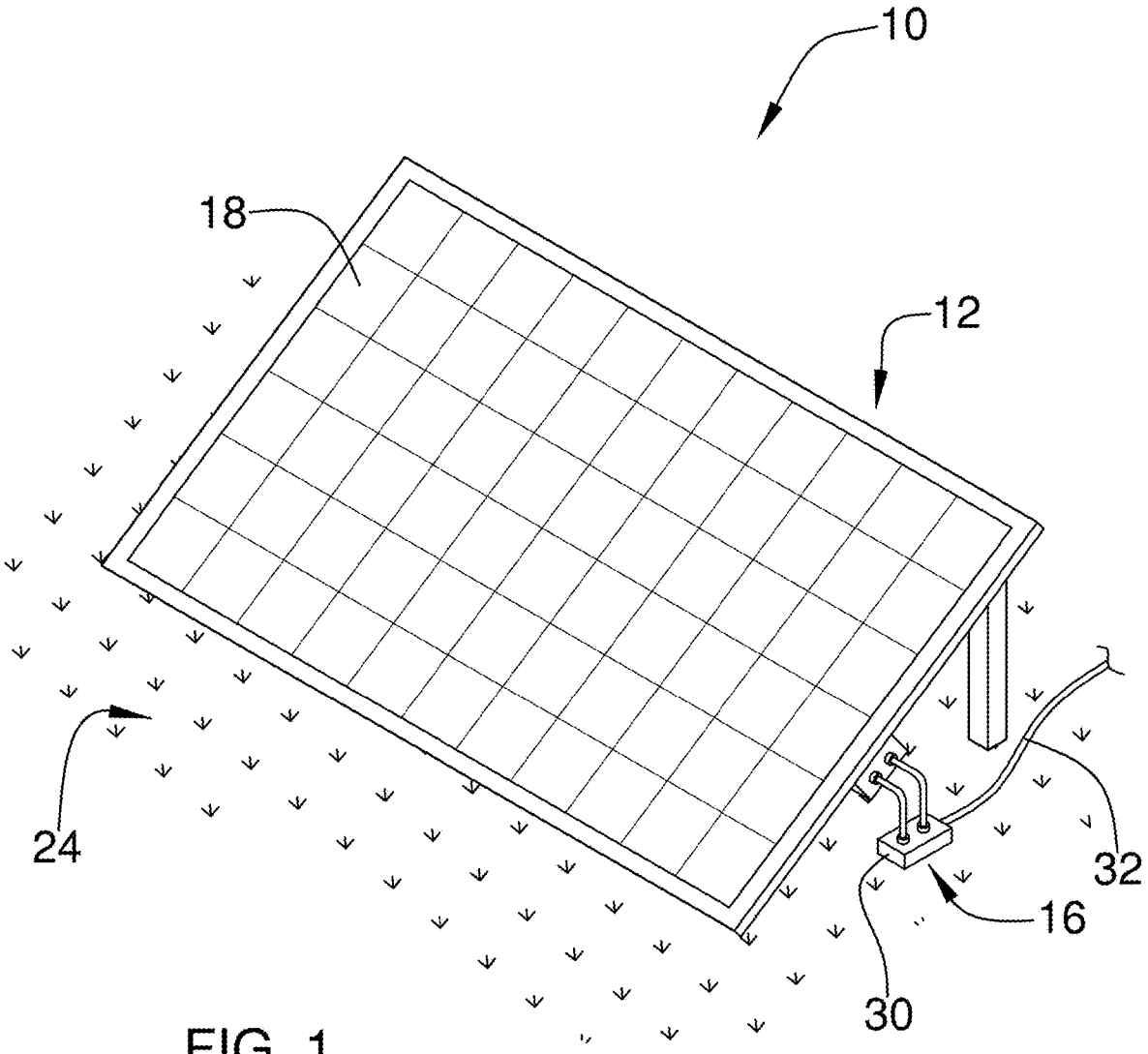
FIG. 1 is a top perspective view of a Seebeck effect renewable energy arrangement according to an embodiment of the disclosure.
Figure 2:
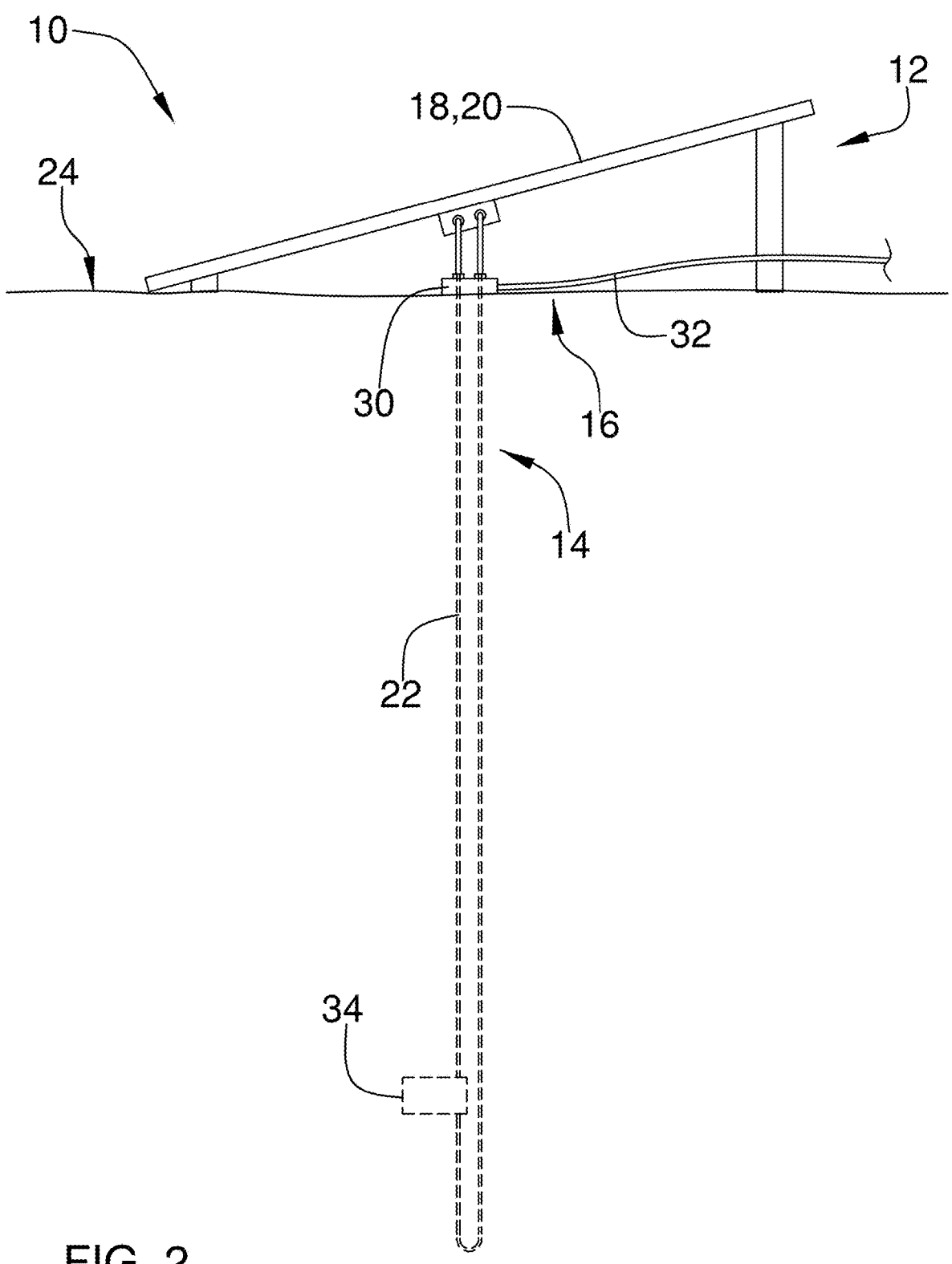
FIG. 2 is a side view of an embodiment of the disclosure.
Figure 3:
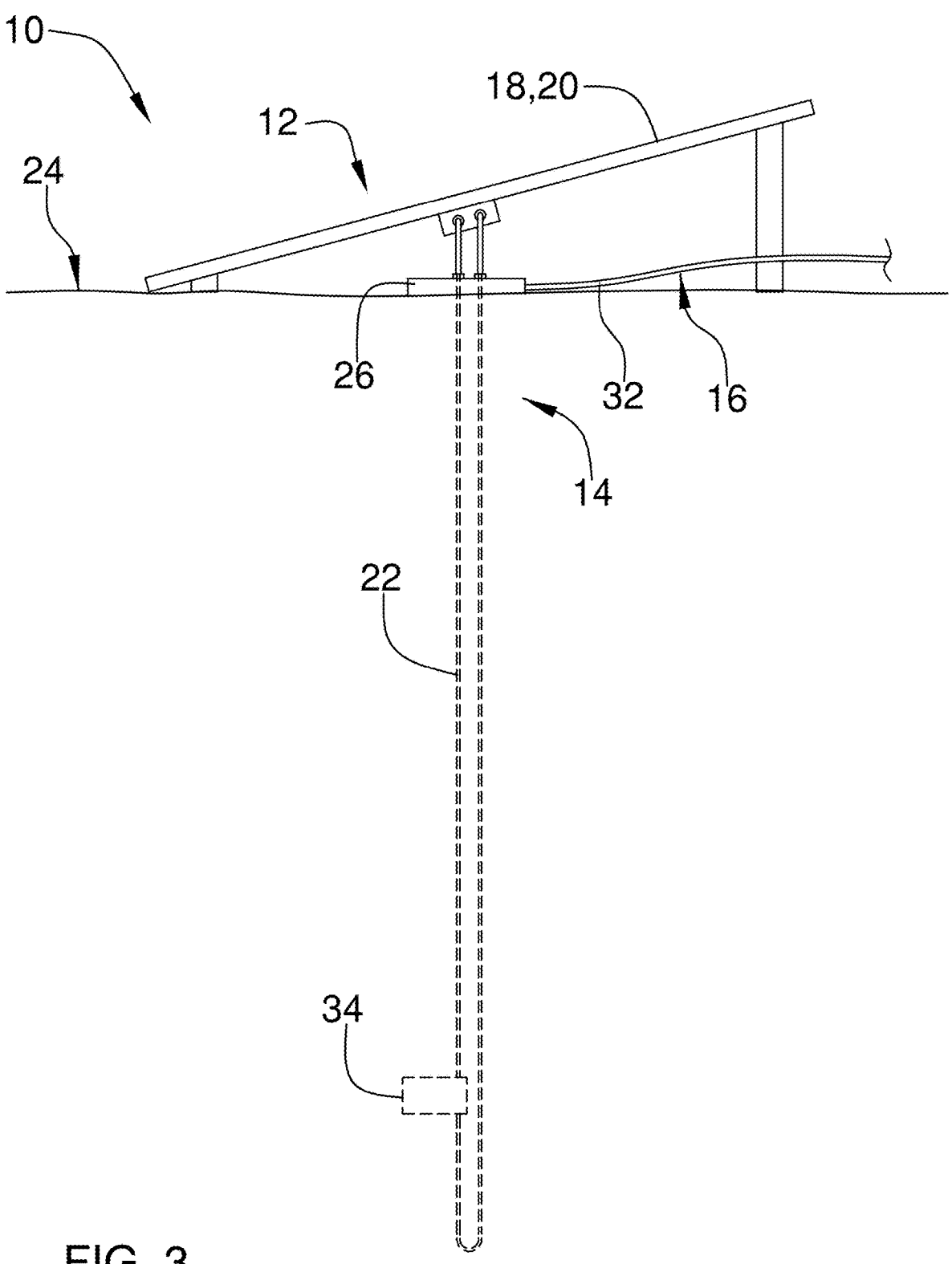
FIG. 3 is a side view of an embodiment of the disclosure.
Figure 4:
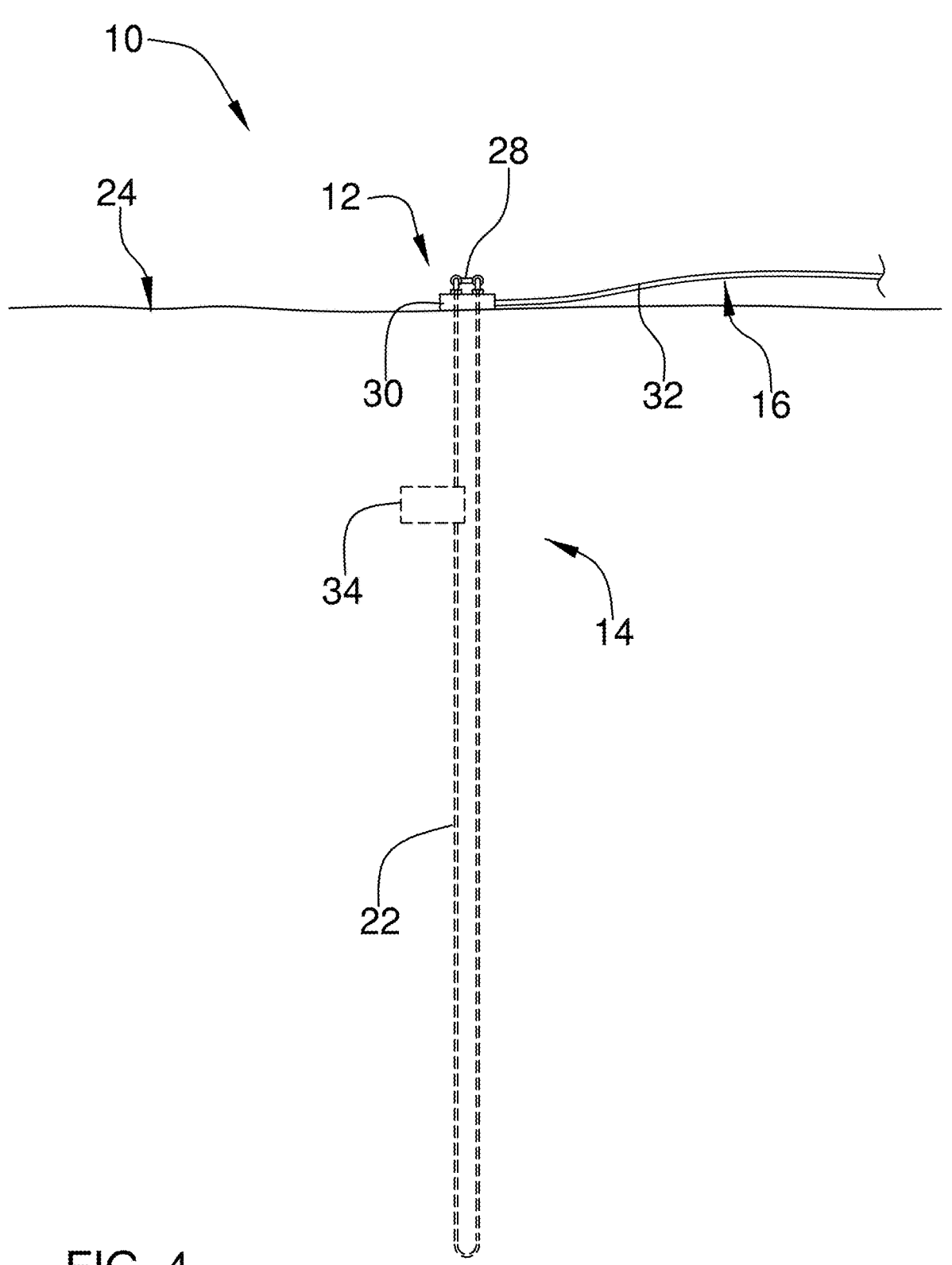
FIG. 4 is a side view of an embodiment of the disclosure.

With reference now to the drawings, and in particular to FIGS. 1 through 8 thereof, a new Seebeck effect renewable energy arrangement embodying the principles and concepts of an embodiment of the disclosure and generally designated by the reference numeral 10 will be described.

As best illustrated in FIGS. 1 through 8, the Seebeck effect renewable energy arrangement 10 generally comprises an environmental arrangement 12, a ground arrangement 14, and a power output arrangement 16. The environmental arrangement 12 is designed to be heated or cooled by surrounding environmental conditions to an environmental temperature. The ground arrangement 14 is designed to be heated or cooled by geothermal energy to a ground temperature different from the environmental temperature. The environmental arrangement 12 is connected to the ground arrangement 14 to create an electrical circuit such that the temperature difference between the environmental temperature and the ground temperature generates electricity due to the Seebeck effect. The power output arrangement 16 is operatively connected to the circuit to conduct electricity generated thereby to storage or use to power electrical devices. The power output arrangement 16 has a known design that can include a connector 30 and a wire or wiring 32 for conducting the generated electricity to use or storage.

In accordance with at least one possible embodiment, the environmental arrangement 12 includes one of: a solar panel 18 designed to be heated by the sun such that the environmental temperature is substantially greater than the ground temperature; and a solar concentrator 20 designed to be heated by the sun such that the environmental temperature is substantially greater than the ground temperature. While FIG. 1 shows a solar panel 18, FIGS. 2 and 3 should be understood as showing a solar panel 18 or a solar concentrator 20.

In accordance with at least one possible embodiment, the ground arrangement 14 includes a loop 22 of electrically-conductive metal wire designed to be buried in the ground 24 or submerged in water. It should be understood that while the figures generally show the environmental arrangement 12 installed on the ground 24, it could also be installed on a roof or at a body of water, such as a pond or lake. In accordance with at least one possible embodiment, the loop 22 is designed to extend approximately 30 feet into the ground or 50 feet into water. In accordance with at least one possible embodiment, the loop 22 includes a thick half on one side with a resistor 34 added near the typical cold side loop end and a thin half on the other side, the thick half is approximately five to seven times as thick as the thin half to create a current difference of approximately four to six times. In accordance with at least one possible embodiment, the loop 22 includes a plurality of strands connected in parallel or in series to increase the maximum deliverable current.

To increase voltage in the loop 22 and enhance efficiency and therefore energy generated, the resistor 34 is positioned in the loop 22. The resistor 34 is inserted at or near the bottom of the loop 22. Positioning at the bottom 36 of the loop 22 when the top level of the loop at ground level is hotter than the mean earth temperature down 100 feet. If the mean earth temperature down 100 feet is warmer than the ground level temperature for a significant portion of the year then the resistor may be place two thirds of the way down from ground level to the bottom of the hole. The return up side of the loop 22 can be any metal typically used in Seeback applications but should have a diameter appropriate for the resultant loop current.

In accordance with at least one possible embodiment, the ground arrangement 14 includes a thermoelectric generator 26 (TEG) operatively connected to the power output arrangement 16. The thermoelectric generator 26 includes a hot side operatively connected to the solar panel 18 or solar concentrator 20 and a cool side operatively connected to the ground 24. In accordance with at least one possible embodiment, the loop 22 of electrically-conductive metal wire is connected to the cool side of the thermoelectric generator 26.

In accordance with at least one possible embodiment, the environmental arrangement 12 includes a platform 28 that is suspended in the air and designed to be warmed or cooled by surrounding air and sun such that the environmental temperature is greater than the ground temperature in warmer seasons and lower than the ground temperature in cooler seasons. In accordance with at least one possible embodiment, the loop 22 of electrically-conductive metal wire with resistor 34 added near the ground level on the thick side of the loop is designed to be buried in the ground 24 to a depth sufficient to be heated by shallow geothermal energy. In accordance with at least one possible embodiment, the thermoelectric generator 26 includes a first side operatively connected to the platform 28 and a second side operatively connected to the loop 22.

In accordance with at least one possible embodiment, a user can generate electricity using the Seebeck effect renewable energy arrangement 10. This process involves heating or cooling the environmental arrangement 12 by surrounding environmental conditions to the environmental temperature and then heating or cooling the ground arrangement 14 by geothermal energy to the ground temperature different from the environmental temperature. This is done passively by allowing heating or cooling by the environmental temperatures and ground temperatures caused by the sun, the wind or air, and the ground 24 or geothermal energy. An electrical circuit is created and electricity is generated due to the Seebeck effect using the temperature difference between the environmental temperature and the ground temperature. The greater the temperature difference, the greater the Seebeck effect and generation of electricity. The generated electricity can then be transmitted via the power output to storage or use to power electrical devices.

Figure 5:
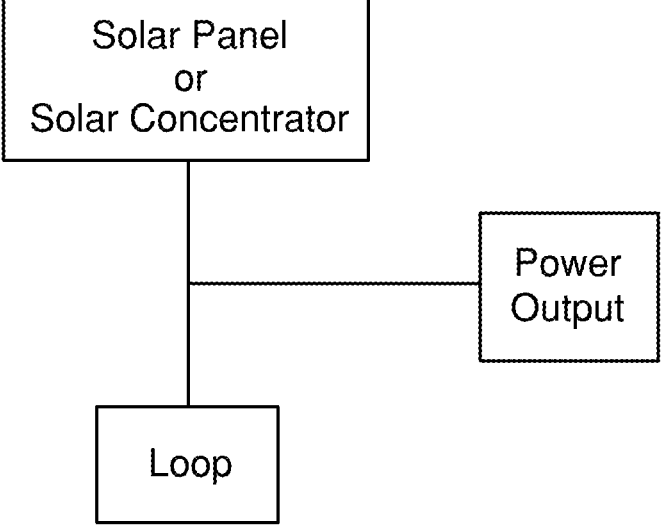
FIG. 5 is a box diagram relating to an embodiment of the disclosure.
Figure 6:
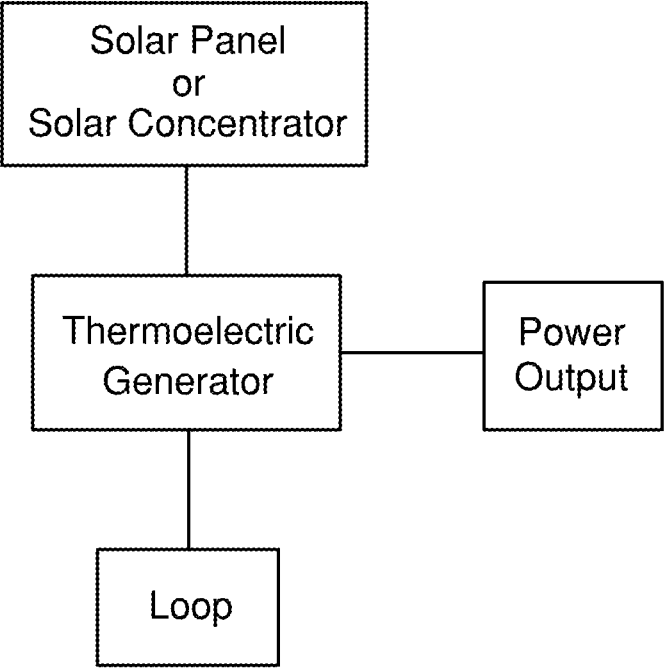
FIG. 6 is a box diagram relating to an embodiment of the disclosure.
Figure 7:
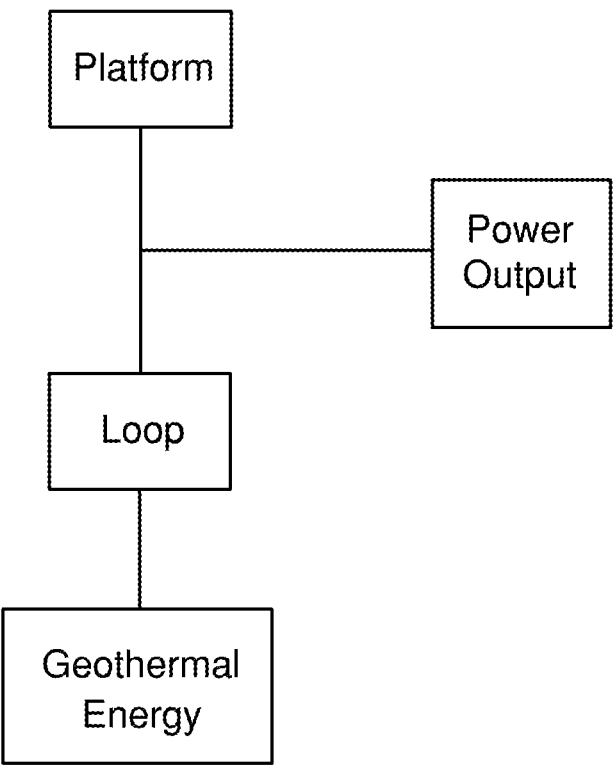
FIG. 7 is a box diagram relating to an embodiment of the disclosure.
Figure 8:
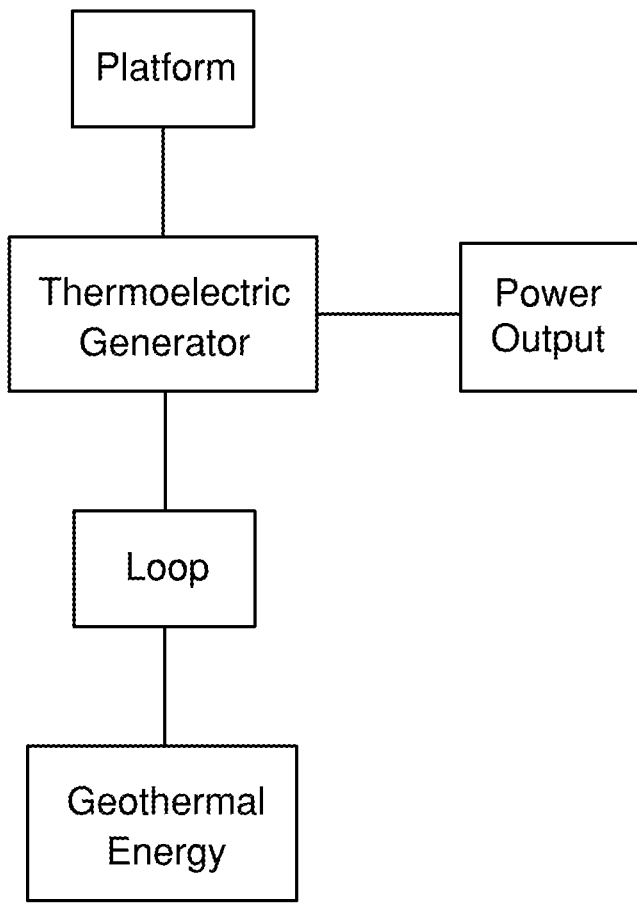
FIG. 8 is a box diagram relating to an embodiment of the disclosure.

FIGS. 5 through 8 are block diagrams showing the relationship between different components of different possible embodiments. FIG. 5 shows a first possible embodiment in which the solar panel 18 or solar concentrator 30 is operatively connected to the loop 22, and both are operatively connected to the power output arrangement 16. FIG. 6 shows a second possible embodiment similar to FIG. 5, but in this embodiment the thermoelectric generator 26 is included. FIG. 7 shows a third possible embodiment in which the platform 28 is operatively connected to the loop 22, which is placed at or in a source of geothermal energy, and both are operatively connected to the power output arrangement 16. FIG. 8 shows a fourth possible embodiment similar to FIG. 7, but in this embodiment the thermoelectric generator 26 is included.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A Seebeck effect renewable energy arrangement for generating electricity due to temperature differences comprising:

an environmental arrangement being configured to be heated or cooled by surrounding environmental conditions to an environmental temperature;

a ground arrangement being configured to be heated or cooled by geothermal energy to a ground temperature different from said environmental temperature;

said environmental arrangement being connected to said ground arrangement to create an electrical circuit such that the temperature difference between said environmental temperature and said ground temperature generates electricity due to the Seebeck effect;

a power output arrangement being operatively connected to said circuit to conduct electricity generated thereby to storage or use to power electrical devices;

wherein said environmental arrangement comprises one of:

a solar panel configured to be heated by the sun such that said environmental temperature is substantially greater than said ground temperature, and a solar concentrator configured to be heated by the sun such that said environmental temperature is substantially greater than said ground temperature;

wherein said ground arrangement comprises a loop of electrically-conductive metal wire configured to be buried in the ground or submerged in water; and a resistor positioned in said loop, wherein said resistor is positioned at a bottom of said loop.

2. A Seebeck effect renewable energy arrangement for generating electricity due to temperature differences comprising:

an environmental arrangement being configured to be heated or cooled by surrounding environmental conditions to an environmental temperature;

a ground arrangement being configured to be heated or cooled by geothermal energy to a ground temperature different from said environmental temperature;

said environmental arrangement being connected to said ground arrangement to create an electrical circuit such that the temperature difference between said environmental temperature and said ground temperature generates electricity due to the Seebeck effect;

a power output arrangement being operatively connected to said circuit to conduct electricity generated thereby to storage or use to power electrical devices;

wherein said environmental arrangement comprises one of:

a solar panel configured to be heated by the sun such that said environmental temperature is substantially greater than said ground temperature, and a solar concentrator configured to be heated by the sun such that said environmental temperature is substantially greater than said ground temperature;

wherein said ground arrangement comprises a loop of electrically-conductive metal wire configured to be buried in the ground or submerged in water;

a resistor positioned in said loop; and wherein said resistor is positioned two thirds of a total depth of said loop down from a top of said loop.

3. The Seebeck effect renewable energy arrangement of claim 1, wherein said loop is configured to extend approximately 30 feet into the ground or 50 feet into water.

4. A Seebeck effect renewable energy arrangement for generating electricity due to temperature differences comprising:

an environmental arrangement being configured to be heated or cooled by surrounding environmental conditions to an environmental temperature;

a ground arrangement being configured to be heated or cooled by geothermal energy to a ground temperature different from said environmental temperature;

said environmental arrangement being connected to said ground arrangement to create an electrical circuit such that the temperature difference between said environmental temperature and said ground temperature generates electricity due to the Seebeck effect;

a power output arrangement being operatively connected to said circuit to conduct electricity generated thereby to storage or use to power electrical devices;

wherein said environmental arrangement comprises one of:

a solar panel configured to be heated by the sun such that said environmental temperature is substantially greater than said ground temperature, and a solar concentrator configured to be heated by the sun such that said environmental temperature is substantially greater than said ground temperature;

wherein said ground arrangement comprises a loop of electrically-conductive metal wire configured to be buried in the ground or submerged in water;

a resistor positioned in said loop;

wherein said loop is configured to extend approximately 30 feet into the ground or 50 feet into water; and wherein said loop comprises a thick half on one side and a thin half on the other side, said thick half being approximately five to seven times as thick as said thin half to create a current difference of approximately four to six times.

5. The Seebeck effect renewable energy arrangement of claim 3, wherein said loop comprises a plurality of strands connected in parallel or in series to increase the maximum deliverable current.

6. The Seebeck effect renewable energy arrangement of claim 1, wherein:

said ground arrangement comprises a thermoelectric generator operatively connected to said power output arrangement; and thermoelectric generator comprises a hot side operatively connected to said solar panel or solar concentrator and a cool side operatively connected to the ground.

7. The Seebeck effect renewable energy arrangement of claim 6, wherein said ground arrangement comprises a loop of electrically-conductive metal wire connected to said cool side of said thermoelectric generator and configured to be buried in the ground or submerged in water.

8. The Seebeck effect renewable energy arrangement of claim 7, wherein said loop is configured to extend approximately 30 feet into the ground or 50 feet into water.

9. A Seebeck effect renewable energy arrangement for generating electricity due to temperature differences comprising:

an environmental arrangement being configured to be heated or cooled by surrounding environmental conditions to an environmental temperature;

a ground arrangement being configured to be heated or cooled by geothermal energy to a ground temperature different from said environmental temperature;

said environmental arrangement being connected to said ground arrangement to create an electrical circuit such that the temperature difference between said environmental temperature and said ground temperature generates electricity due to the Seebeck effect;

a power output arrangement being operatively connected to said circuit to conduct electricity generated thereby to storage or use to power electrical devices;

wherein said environmental arrangement comprises one of:

a solar panel configured to be heated by the sun such that said environmental temperature is substantially greater than said ground temperature, and a solar concentrator configured to be heated by the sun such that said environmental temperature is substantially greater than said ground temperature;

wherein said ground arrangement comprises a loop of electrically-conductive metal wire configured to be buried in the ground or submerged in water;

a resistor positioned in said loop;

wherein said ground arrangement comprises a thermoelectric generator operatively connected to said power output arrangement;

wherein said thermoelectric generator comprises a hot side operatively connected to said solar panel or solar concentrator and a cool side operatively connected to the ground;

wherein said ground arrangement comprises a loop of electrically-conductive metal wire connected to said cool side of said thermoelectric generator and configured to be buried in the ground or submerged in water;

wherein said loop is configured to extend approximately 30 feet into the ground or 50 feet into water; and wherein said loop comprises a thick half on one side and a thin half on the other side, said thick half being approximately five to seven times as thick as said thin half to create a current difference of approximately four to six times.

10. The Seebeck effect renewable energy arrangement of claim 7, wherein said loop comprises a plurality of strands connected in parallel or in series to increase the maximum deliverable current.

11. The Seebeck effect renewable energy arrangement of claim 1, wherein said environmental arrangement comprises a platform being suspended in the air and configured to be warmed or cooled by surrounding air and sun such that said environmental temperature is greater than said ground temperature in warmer seasons and lower than said ground temperature in cooler seasons.

12. The Seebeck effect renewable energy arrangement of claim 11, wherein said ground arrangement comprises a loop of electrically-conductive metal wire configured to be buried in the ground to a depth sufficient to be heated by shallow geothermal energy.

13. The Seebeck effect renewable energy arrangement of claim 12, wherein:

said ground arrangement comprises a thermoelectric generator operatively connected to said power output arrangement; and thermoelectric generator comprises a first side operatively connected to said platform and a second side operatively connected to said loop.

\* \* \* \* \*